United States Patent [19]

Hood

[11] Patent Number: 4,711,702

[45] Date of Patent: Dec. 8, 1987

[54] PROTECTIVE CONTAINERBOARD

[75] Inventor: Paul F. Hood, Stamford, Conn.

[73] Assignee: Stone Container Corporation, Chicago, Ill.

[21] Appl. No.: 779,968

[22] Filed: Sep. 25, 1985

[51] Int. Cl.$^4$ .......................... D21F 11/00; D21H 3/78
[52] U.S. Cl. ..................................... 162/123; 162/138; 162/158; 162/231; 206/328
[58] Field of Search ............... 162/138, 160, 123, 132, 162/181, 9, 158, 231, 168.2; 156/462, 208, 207; 206/328; 428/179, 182

[56] References Cited

U.S. PATENT DOCUMENTS 4,559,103 12/1985 Nomura et al. ...................... 162/160
4,606,790 8/1986 Youngs et al. ...................... 162/138

OTHER PUBLICATIONS

Casey, *Pulp and Paper*, vol. III, (1981), pp. 1578, 1579, 1603, 1604.

*Primary Examiner*—Peter Chin
*Attorney, Agent, or Firm*—Silverman, Cass, Singer & Winburn, Ltd.

[57] ABSTRACT

Antistatic cartons of containerboard having 0.3 to 3.5 percent by weight conductive carbon for protecting electrostatic discharge sensitive devices. The containerboard is made from an alkaline pulp which eliminates acid contamination, increases shelf life, provides Mullen burst strength in the linerboard which exceeds 90($\pm$1) pounds per square inch. The surface resistivity is in the range of from $10^3$ to $10^9$ ohms per square. The carton includes conductive adhesives to insure dissipation of any static charges.

12 Claims, No Drawings

PROTECTIVE CONTAINERBOARD

BACKGROUND OF THE INVENTION

The invention relates to corrugated containers and containerboard made from alkaline cellulosic pulp which has an uncombined carbon constituent for antistatic protection and has increased shelf life without undue loss of containerboard strength and with minimization of objectionable carbon "rub-off." The containerboard of the invention is especially useful for protecting electrostatic discharge sensitive devices against static electricity damage, electromagnetic damage and physical damage of the type which could occur during handling or storage. The alkaline pulp minimizes acid and other contamination of the contents of containers made from the containerboard and provides increased shelf life over containers made from acid pulps. Containers or cartons made from the novel containerboard are for parts used in electronics, for example, with precious metal contacts which are contaminable by acid fumes, sulfur, etc., and which are susceptible to static electricity damage and physical damage from handling or storage.

It is known in the art to provide containers made from cellulosic pulp containerboard having a coating of carbon containing conductive material. See U.S. Pat. Nos 4,160,503; 4,211,324; 4,293,070 and 4,482,048. U.S. Pat. Nos. 3,096,229 and 3,012,928 teach impregnating a paper web with carbon. It is also known to make paper from activated carbon filled pulp or graphite filled pulp with minimum "rub-off" characteristics. See in this regard, U.S. Pat. No. 3,149,023 which discloses a low burst strength paper (Mullen burst test 3.2 p.s.i.) which is unsuitable as containerboard of the type which protects electronic parts from physical damage. See also, U.S. Pat. No. 4,308,953 for a discussion of conductive materials for cartons. For anti-static discussions, U.S. Pat. Nos. 3,062,700; 4,037,267; 4,038,693; 4,084,210; 4,150,418; 4,231,901; 4,241,829; 4,247,002; 4,427,114 and 4,455,350 are also of interest.

SUMMARY OF THE INVENTION

The invention relates to cartons of containerboard of improved strength for protecting electrostatic discharge sensitive devices against static electricity damage, electromagnetic damage, emitted acid and sulfur contaminants and physical damage from handling and storage. The novel containerboard includes uncombined carbon with minimum "rub-off" characteristics and is formed from an alkaline pulp characterized by a shelf life in excess of that provided by containerboard made from acid pulps and subject to degradation. The alkaline pulp also is characterized by a minimization of the problems of contaminating corrosive emissions and low Mullen burst test strengths which carbon filled acid pulps have previously exhibited.

The carbon utilized is a conductive carbon powder which is mixed with the cellulosic fibrous material and paper size. The carbon powder is, for example, "Conductex SC" from Columbian Chemicals Co. The cellulosic fibers are, for example, repulped randomly selected corrugated cartons having a consistency of 3% and a pH adjusted to 8.5 by a sodium hydroxide addition. The pulp freeness is, for example, 325 CSF. The paper size is, for example, an alkylketene dimer prepared from long chain fatty acids and sold by Hercules Powder Company under the trademark "Aquapel" or a related Hercules product named "Neuphor."

The containerboard made from this pulp, when measured from a sample handsheet having a caliper of $10(\pm 1)$ mils, exhibits the following properties:
  uncombined carbon within the range of from 0.3 to 3.5 per cent by weight;
  a Mullen burst strength which exceeds $90(\pm 1)$ pounds per square inch;
  a resistance to failure in the ring crush test in excess of $60(\pm 1)$ pounds; and
  a surface resistivity within the range of from $10^3$ to $10^9$ ohms per square (when tested by ASTM D-257.)

The cellulosic fibrous box material was beaten for 2 minutes and hydrated to a consistency of 3% (97% water). Sufficient sodium hydroxide to bring the pH up to 8.5 was added and the pulp then beaten 4 to 5 minutes. Then, the synthetic paper size "Aquapel" was added and the pulp beaten for 2 minutes before conductive carbon within the range of from 1 to 10% by weight (dry) was added and the pulp beaten for 25–30 minutes to produce a homogenous uncombined carbon loaded pulp which exhibited a freeness of 325 C.S.F. The conductive carbon was the "Conductex SC" carbon mentioned above, which when the pulp was dewatered and dried to form containerboard handsheets, remained as uncombined carbon within the range of from 0.3 to 3.5 percent by weight given above.

The handsheets were tested for caliper, tensile strength and stretch, Mullen burst and Elmendorf tear in accordance with TAPPI procedure T-220 OM-83. The "H and D" crush test was in accordance with T-818 OM-82 using a 5 inch strip. Moisture or solids content was tested by TAPPI procedure T-412 OM-83. The handsheets were conditioned for test in accordance with T-402 OS-70.

The novel containerboard formed is ideally suited for protecting electrostatic discharge sensitive devices against static electricity damage, electromagnetic damage, emitted acid and sulfur contaminants and physical damage from handling and storage.

DETAILED DESCRIPTION OF THE INVENTION

In the electronics industry, static electricity and magnetic fields can seriously and deleteriously alter the sensitive component and circuit elements which are the modules from which electronic apparatus used in industry, military and home are built. Metal shields to protect electronic components have long been used in the design of electronic devices, but they have the objection of both weight and bulkiness. In storage and transfer of electronic devices boxes with conductive coatings or bags of carbon loaded plastic film material have been used for this purpose.

The containerboard of the invention is an improvement in that it is strong enough to be used in corrugated box structures to prevent physical damage to sensitive electronic parts shipped in them and it has a conductivity measured in surface resistivity terms which makes it a suitable electrostatic and electromagnetic shield. The containerboard is made of carbon filled pulp which has the uncombined carbon fixed against rub-off.

Because of the particular range of carbon utilized in the synthetically sized alkaline pulp, the containerboard is of superior strength. When measured from a handsheet sample having a caliper of $10(\pm 1)$ mils, it has Mullen burst strength above $90(\pm 1)$ pounds per square inch (p.s.i.). The "H and D" or "Hinde and Hauch" ring crush test reading for the containerboard handsheets exhibited a resistance to failure in excess of $60(\pm 1)$ pounds. The average stretch of the carbon loaded containerboard material handsheet before failure exceeds 2.5 per cent extension which is very favorable in containerboard and indicates a characteristic suitable for making corrugated boxes of great utility in protecting electronic parts.

In order to verify that it provides an effective shield against electrostatic and electromagnetic damage, the containerboard of the invention has been tested successfully under Federal Test Method STD. No. 101C, Method 4046.1, Change Notice 1, dated Oct. 8, 1982, which relates to "Electrostatic Properties of Materials." Electrostatic properties are defined as the ability of a material, when grounded, to dissipate a charge induced on the surface of the material.

In general, surface resistivity within the range of from $10^3$ to $10^5$ ohms per square (or square unit) are considered by those skilled in the art to be "conductive;" surface resistivity within the range of from $10^5$ to $10^7$ ohms per square (or square unit) are considered to be "antistatic;" and, surface resistivity within the range of from $10^7$ to $10^{10}$ ohms per square (or square unit) are considered to be "resistive" or "dissipative." The surface resistivity of all of these ranges and within the range of $10^3$ to $10^9$ will produce varying degrees of electrostatic and electromagnetic protection when measured as the ability to dissipate a charge induced on the surface of the material. The duration of the undissipated charge will vary with the resistivity. The higher the conductivity, i.e., lower the resistivity, the more protective the containerboard. A normal corrugated container linerboard, however, has a surface resistivity of approximately within the range of $10^{13}$ to $10^{20}$ depending on moisture content and other factors such as pH. They will not readily dissipate a static charge or electromagnetically shield the contents of a carton. The instant containerboard resistivity is less moisture sensitive than prior acid pulp containerboard.

The types of electrosensitive discharge devices which may be protected by containers made of the novel containerboard are, typically, microcircuits, sensitive semiconductor devices, sensitive resistors, integrated circuits, "chips" and associated higher assemblies. These devices, heretofore, have been shipped in containers with conductive coatings on their panels. The containerboard of the instant invention eliminates the cost and disadvantages of coating and provides a containerboard of conductivity and shielding throughout regardless of the size or shape of the container made from it.

The containerboard, in addition to having a resistance to carbon "rub-off", will not dust at the scorelines when folded. This is a very important factor in that external conductive or antistatic coatings of prior art board can result in dusting which can deposit on the packaged product and cause damage or short circuits. Only small amounts of "Aquapel", for example, 3 pounds per ton are sufficient for this purpose. Moreover, no starch addition is neccessary when "Aquapel" is used to "fix" carbon, as is the case in acid pulps in which alum is used to fix uncombined carbon.

Containerboard constructed according to the principals of the invention combine in a satisfactory manner on a corrugator when attention is given to adhesion of the linerboard and corrugated medium. It has been found that vinamyl waterproof conductive adhesive formulations are quite satisfactory. The adhesive has conductive carbon black or an ammonium salt added to it and is diluted until it will not arc when current is passed between the linerboard and corrugated medium.

In making the novel conductive carton, the vinamyl full waterproof adhesive (supplied by National Starch and Chemical Corporation) is used to adhere the three plies (for single-wall board), or five plies (for double-wall board), or seven plies (for triple-wall board), together after first being made conductive. The prepared adhesive has a high amylose content (20 per cent by weight), an alkaline pH of approximately $11\frac{1}{2}$ to $12\frac{1}{2}$ and a dry solids content of 32.8 per cent by weight. Its viscosity is 35–45 seconds (Stein Hall Cup). To this adhesive formulation is added a conductive polymer to produce a finished adhesive in the conductive range having $10^3$ to $10^5$ ohm/square surface resistivity.

The conductive additive is polydimethyldiallyl ammonium chloride or, p-DMDAC, supplied by CPS Chemical Company, Inc. under the trademark "Aqestat 42." The preferred addition is 18.5 percent by weight of total starch in the adhesive, but additions may be made within the range of 15 to 35 percent by weight.

To insure the conductivity of the containerboard carton, the "manufacturer's joint" is provided by means of a polyvinyl acetate adhesive commonly called "white glue" in the industry. An example is made and sold by H. B. Fuller Co. and designated "No. xx3875." The "white glue", No. xx3875 is an alkaline resin glue of 55 percent solids by weight and a viscosity of 1000 to 3000 C.P.S. To this adhesive is added a conductive polymer to produce a finished adhesive having $10^3$ to $10^5$ ohm/square surface resistivity (conductive range). To this adhesive formulation is added the conductive polymer p-DMDAC within the range of 5 to 20 percent by weight, based on resin solids in the adhesive. The preferred addition is 12 percent.

Cartons made of the novel carbon loaded containerboard having conductive vinamyl adhesive adhering its plies of linerboard and corrugating medium and conductive polyvinyl acetate adhesive to make its "manufacturer—s joint" are ideal electrostatic and electromagnetic protection containers. They easily can achieve a 200 pound strength rating in a single-wall box, which is roughly gauged by adding the linerboard strengths in Mullen burst p.s.i. on either side of the corrugating medium. Thus, linerboard of a 100 p.s.i. Mullen burst strength will produce a "200 pound" rated single-wall box and linerboard of 90 p.s.i. Mullen burst strength would be given a "175 pound" rating, the next lower commercial rating below 200 pounds.

In scaling up the handsheet examples to a paper machine, the fibers were obtained from recycled paper. The sodium hydroxide was added to control the slurry pH to within 8.3–8.7 pH. The preferred pH was 8.5. The sodium hydroxide was purchased as a 50 percent solids solution and diluted with water to a 20 percent solids solution to add to the pulp slurry. The range of addition was 0.3 pounds of sodium hydroxide solids (dry) per finished product (linerboard or corrugating medium) to 2.4 pounds per ton. The average usage to maintain pH control is 0.9 pounds per ton.

The conductive containerboard, linerboard and corrugating medium, because it is alkaline, is free of acid and acid emitting materials thus eliminating corrosiveness to the metal parts of the integrated circuits, microchips, etc. that they are to contain. The alkaline characteristic also gives better strength and shelf life to the cartons.

Described below are typical test values for containerboard in the "conductive" range made on a paper machine according to the invention.

For corrugating medium of a caliper of 10 mils, the average Elmendorf Tear was 222.5 grams per square meter, the average tensile strength was 56.4 pounds per inch and the average "H and D" ring crush test (6 inch test strip) was 88.7 pounds. Since this was corrugating medium no Mullen burst test was performed but the standard "Corrugating Medium Test" was 71 pounds.

For a linerboard of a caliper of 12 mils the Mullen burst test was 112.5 pounds per square inch, the average Elmendorf Tear was 287.2 grams per square meter, the average tensile strength was 60.8 pounds per inch and the average "H and D" ring crush test (6 inch test strip) was 97.2 pounds.

For a linerboard of a caliper of 19 mils the Mullen burst test was 137.8 pounds per square inch, the average Elmendorf Tear was 385.2 grams per square meter, the average tensile strength was 81.1 pounds per inch and the average "H and D" ring crush test (6 inch test strip) was 135.1 pounds.

The "averages" referred to above are arrived at by arithmetically averaging the readings from the machine direction and the cross direction. The standard Corrugating Medium Test refers to the "Flat Crush Test of corrugating medium" T-809 OM-82.

The handsheet test data is listed in the Table below:

TABLE I

| % Carbon dry wt. | 0.0 | 0.1 | 0.2 | 0.7 | 1.6 | 3.5 | 8.2 | 10.7 | 13.2 |
|---|---|---|---|---|---|---|---|---|---|
| caliper mils | 11.0 | 9.6 | 10.0 | 9.6 | 9.6 | 9.6 | 10.5 | 10.6 | 9.8 |
| Elmendorf Tear g/m$^2$ | 231 | 266 | 263 | 234 | 236 | 248 | 198 | 168 | 239 |
| Tensile Strength lbs/in. | 51.8 | 27.0 | 26.6 | 29.0 | 26.3 | 25.8 | 40.1 | 35.1 | 32.6 |
| stretch % | 3.2 | 3.1 | 3.1 | 3.0 | 2.6 | 2.5 | 2.5 | 2.5 | 1.1 |
| Mullen burst lbs/in.$^2$ | 73.3 | 112.4 | 99.9 | 108.8 | 93.6 | 89.0 | 59.3 | 43.8 | 44.5 |
| "H & D" Crush lbs. | 22.7 | 56.6 | 55.1 | 65.2 | 61.4 | 61.4 | 19.4 | 20.1 | 16.9 |
| Surface Resistivity/sq. | $10^9$ | $10^9$ | $10^9$ | $10^5$ | $10^4$ | $10^3$ | $10^3$ | $10^3$ | $10^2$ |
| % solids dry wt. | 91.2 | 91.0 | 90.9 | 91.2 | 91.5 | 91.7 | 92.0 | 92.0 | 92.2 |

By graphic interpolation, it has been determined that surface resistivity enters the $10^9$ - $10^3$ ohms per square "dissipative", "anti-static" - "conductive" range at approximately 0.3 percent by weight of uncombined carbon. By the same means it has been determined Mullen burst strength remains above 90($\pm$1) pounds, and the ring crush test indicates a resistance to failure in excess of 60($\pm$1) pounds, from 0.3 percent up to 3.5 percent by weight of uncombined carbon. These values define the range of carbon in which the invention is, accordingly, best utilized.

The novel all conductive container described above forms a surface for quickly dissipating static charges and this provides superior static electricity protection. This is because of the conductive nature of the linerboard, the corrugating medium, the ply adhesive and the manufacturer's joint glue.

What is claimed is:

1. A containerboard of improved strength for protecting electrostatic discharge sensitive devices against static electricity damage, electromagnetic damage and physical damage;
said containerboard being formed from an alkaline pulp, including a mixture of beaten cellulosic fibrous material, alkylketene dimer size and uncombined carbon powder and being characterized, when measured from a sample having a caliper of 10($\pm$1) mils, by the following properties:
wherein said alkylketene dimer is present in an amount sufficient to fix said uncombined carbon powder within the range of from 0.3 to 3.5 percent by weight, a Mullen burst strength which exceeds 90($\pm$1) pounds per square inch and a surface resistivity within the range of from $10^3$ to $10^9$ ohms per square.

2. The containerboard of claim 1 in which the ring crush test indicates a resistance to failure in excess of 60($\pm$1) pounds.

3. The containerboard of claim 1 in which the average stretch of the material before failure exceeds 2.5 per cent extension.

4. The containerboard of claim 1 in which the surface resistivity is within the range $10^3$ - $10^5$ ohms per square.

5. The containerboard of claim 1 in which components of linerboard and corrugating medium are adhesively joined by means of an adhesive having conductive material additions.

6. The containerboard of claim 5 in which the adhesive having conductive material additions is a vinamyl waterproof adhesive with high amylose content and a conductive polymer within the range of 15 to 35 percent by weight of the total starch solids.

7. The containerboard of claim 6 in which the conductive polymer is polydimethyldiallyl ammonium chloride.

8. The containerboard of claim 5 in which a manufacturer's joint of conductive glue and a plurality of scored fold lines are provided to define a carton.

9. The containerboard of claim 8 with a manufacturer's joint of conductive glue in which the conductive glue is white glue to which is added a conductive polymer.

10. The containerboard of claim 9 in which the conductive polymer is polydimethyldiallyl ammonium chloride.

11. A method of making alkaline containerboard of improved strength having a surface resistivity within the range of from about $10^3$ to about $10^9$ ohms per square for producing containers for protecting electrostatic discharge sensitive devices against static electricity damage, electromagnetic damage and physical damange, comprising the steps of:
(a) beating a cellulosic fibrous material with adjustment of the pH to bout 8.5;
(b) adding alkylketene dimer size and conductive carbon powder sufficient to provide a surface resistivity within the range of from about $10^3$ to about $10^9$ ohms per square, of the containerboard to be produced, and beating to produce a homogeneous uncombined carbon-loaded pulp, said alkylketene dimer size being present in an amount sufficient to fix said carbon powder to provide said resistivity; and (c) making a containerboard sheet from said pulp.

12. The pulp produced by the process comprising the steps of:

(a) beating a cellulosic fibrous material with adjustment of the pH to about 8.5; and (b) adding alkylketene dimer size and conductive carbon powder sufficient to provide a surface resistivity within the range of from about $10^3$ to about $10^9$ ohms per square, of the containerboard to be produced, and beating to produce a homogeneous uncombined carbon-loaded pulp, said alkylketene dimer size being present in an amount sufficient to fix said carbon powder to provide said resistivity.

* * * * *